US010263582B1

(12) United States Patent
Yoo et al.

(10) Patent No.: US 10,263,582 B1
(45) Date of Patent: Apr. 16, 2019

(54) VARIABLE GAIN AMPLIFIER WITH GAIN-BASED COMPENSATION

(71) Applicant: Marvell International Ltd., Hamilton (BM)

(72) Inventors: Myung Jae Yoo, Sunnyvale, CA (US); Ahmed Hesham Mostafa, San Jose, CA (US); Zubir Adal, Union City, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/903,876

(22) Filed: Feb. 23, 2018

Related U.S. Application Data

(60) Provisional application No. 62/463,465, filed on Feb. 24, 2017.

(51) Int. Cl.
*H03G 3/00* (2006.01)
*H03G 3/30* (2006.01)
(52) U.S. Cl.
CPC ........... *H03G 3/008* (2013.01); *H03G 3/3031* (2013.01)
(58) Field of Classification Search
CPC .................................................... H03G 3/008
See application file for complete search history.

(56) References Cited

U.S. PATENT DOCUMENTS

| 4,833,418 A * | 5/1989 | Quintus | H03F 3/45475 330/258 |
| 5,099,204 A * | 3/1992 | Wheatley, III | H03G 3/3036 330/279 |
| 6,509,746 B1 * | 1/2003 | Wang | G01D 5/24 324/678 |
| 2007/0132512 A1 * | 6/2007 | Miyazaki | H03F 1/56 330/278 |
| 2009/0027116 A1 * | 1/2009 | Bach | H03G 3/3036 330/2 |
| 2014/0190237 A1 * | 7/2014 | Park | G01L 9/125 73/1.57 |

* cited by examiner

*Primary Examiner* — Patricia T Nguyen

(57) ABSTRACT

The present disclosure describes variable gain amplifiers with gain-based compensation. In some embodiments, a variable gain amplifier (VGA) includes a gain stage, an output stage, a compensation stage, and a capacitor coupled between respective outputs of the gain stage and compensation stage. A gain of the VGA is configured, based on a gain setting, to amplify signals received by the variable gain amplifier. A gain of the compensation stage is configured, based on the gain setting, to alter an effective capacitance of the capacitor, which is applied to the output of the gain stage for compensation of the VGA. By altering the effective capacitance based on the gain setting of the VGA, compensation capacitance is adjusted continuously with changes in the gain setting and at a similar resolution. In various embodiments, the continuous adjustment of the compensation capacitance across different gain levels prevents discontinuities in amplifier compensation.

20 Claims, 11 Drawing Sheets

VARIABLE GAIN AMPLIFIER WITH GAIN-BASED COMPENSATION

CROSS REFERENCE TO RELATED APPLICATIONS

This present disclosure claims priority to U.S. Provisional Patent Application Ser. No. 62/463,465 filed Feb. 24, 2017, the disclosure of which is incorporated by reference herein in its entirety.

BACKGROUND

Many computing and electronic devices store information using magnetic media, such as hard disk drives. Generally, the information is stored by encoding the information into a series of bits and then writing the encoded bits to a layer of magnetic material on one or more disks of magnetic media. To do so, a read-write head of the media drive produces, based on values of the encoded bits, a magnetic field strong enough to polarize small portions of the magnetic media. As the disk coated in magnetic media turns below the read-write head, the changing magnetic field of the read-write head imparts different polarities to respective sections of the magnetic media that correspond to the series of encoded bits. In other words, the read-write head writes a sequence of ones and zeros into the magnetic media as a corresponding sequence of north-south or south-north magnetic polarities.

To read the information from the magnetic media disk, the read-write head picks-up or senses the polarity variations from a surface of the magnetic media. Signals associated with sensing polarity of each section of the magnetic media, however, are often weak or vary greatly depending on characteristics of the magnetic media or a position of the read-write head relative the magnetic media disk. To address these issues, many media drives include an amplifier circuit to amplify the signal provided by the read-write head by varying levels before attempting to decode the signal in order to determine the sequence of bits that were previously written to the magnetic media.

Amplifying the signals at low levels of gain, however, reduces phase margin of some amplifiers with feedback circuitry and necessitates an increase in compensation capacitance to maintain stability of the amplifier circuit. Although compensation capacitors can be added to maintain amplifier stability, a large number of capacitors and complex switching circuitry are typically needed to achieve sufficient compensation over wide ranges of gain adjustment. Further, with compensation capacitors of discrete capacitance values, the provided compensation capacitance is suboptimal across all but a few select gain levels, resulting in a loss of amplifier bandwidth due to over compensation. These and other issues associated with switching in capacitors of different capacitance values, which disrupts the compensation, often result in glitches at the amplifiers output and incorrect operation of amplifier gain control.

The background description provided herein is for the purpose of generally presenting the context of the disclosure. Unless otherwise indicated herein, the approaches described in this section are not prior art to the claims in this application and are not admitted to be prior art by inclusion in this section.

SUMMARY

In some aspects and in accordance with a method, an embodiment of a variable gain amplifier amplifies an analog signal read from a magnetic media disk. The variable gain amplifier receives the analog signal from a read head configured to generate the analog signal based on digital data stored on the magnetic media disk. A gain setting is determined for a variable gain amplifier that has a gain stage, an output stage, a compensation stage, and a capacitor coupled between an output of the gain stage and an output of the compensation stage. In some cases, the capacitor is disposed in a compensation path formed between the output of the compensation stage and the output of the gain stage, at which compensation capacitance is applied to maintain amplifier stability. A gain of the variable gain amplifier is configured based on the gain setting. A gain of the compensation stage is also configured based on the gain setting to alter, via the gain of the compensation stage, an effective capacitance of the capacitor that is coupled to the output of the compensation stage.

The capacitor provides compensation at the output of the gain stage, and as such, altering or varying the effective capacitance of the capacitor enables selective compensation of the variable gain amplifier. By using the gain of the compensation stage, which can be controlled precisely, to control the amount of capacitance applied to the output of the gain stage, the compensation of the variable gain amplifier is adjusted continuously and smoothly with varying amounts of gain in the gain stage. For example, a gain setting may be coded using eight-bit resolution to provide not only 256 gain levels, but also 256 corresponding levels of compensation capacitance through compensation stage gain that is used to vary the amount of capacitance (compensation capacitance) applied to (or seen) at the output of the gain stage. The signal is subsequently amplified at the configured gain with the compensated variable gain amplifier.

In other aspects, a data storage apparatus comprises a media disk configured to store digital data and a read head configured to generate, when reading the media disk, an analog signal based on the digital data. The data storage apparatus also includes an analog front-end having a variable gain amplifier, automatic gain controller, and an analog-to-digital converter. The variable gain amplifier includes a gain stage configured to amplify the analog signal to provide an amplified analog signal, an output stage, a compensation stage, and a capacitor coupled between an output of the gain stage and an output of the compensation stage. By implementing separate gain, output, and compensation stages, the variable gain amplifier is configurable to amplify the analog signal and the compensation stage, which isolates the gain stage output from feedback resistors or capacitive loading, is configurable to alter an application of the capacitance for compensation of the variable gain amplifier.

In an embodiment, the automatic gain controller is configured to determine a gain setting and set, based on the gain setting, a gain of the variable gain amplifier. The automatic gain controller is also configured to selectively set, based on the gain setting, a gain of the compensation stage to alter an effective capacitance of the capacitor, which is applied to the output of the gain stage for compensation. By altering the amount of capacitance applied to the output of the gain stage based on the gain setting, compensation of the gain stage, and thus the variable gain amplifier, can be adjusted continuously in small increments (e.g., smoothly) as gain of variable gain amplifier changes. The analog-to-digital converter is configured to convert the amplified analog signal to a digital signal. A digital processor of the data storage apparatus is configured to decode, based on the digital signal, the digital data read from the media disk.

In yet other aspects, an System-on-Chip (SoC) for processing signals read from a magnetic media disk comprises an input configured to receive an analog signal from a magnetic media read head and a variable gain amplifier. The variable gain amplifier includes a gain stage that is configured to amplify the analog signals and an output stage that is configured to isolate the gain stage from an output of the variable gain amplifier. The amplifier also has a compensation stage, and a capacitor coupled between respective outputs of the gain stage and compensation stage. An analog-to-digital converter of the SoC is configured to convert the amplified analog signal to a digital signal, which an output of the SoC is configured to transmit. The SoC also includes a gain controller that is configured to adjust, based on the digital signal, a gain setting of variable gain amplifier. The gain controller also adjusts, based on the gain of the variable gain amplifier, a gain setting of the compensation stage to which the capacitor is coupled. This alters an amount of capacitance, or effective capacitance, of the capacitor that is applied to the output of the gain stage for compensation of the variable gain amplifier. By using the gain of the compensation stage, which is selectably configurable based on the gain setting, the amount of capacitance applied to the output of the gain stage is adjusted continuously and smoothly with changes in gain of the variable gain amplifier, in an embodiment.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of a variable gain amplifier with gain-based compensation are set forth in the accompanying figures and the detailed description below. In the figures, the left-most digit of a reference number identifies the figure in which the reference number first appears. The use of similar reference numbers but with reference to different drawings in the description and the figures indicates like elements.

DETAILED DESCRIPTION

Figure 1:
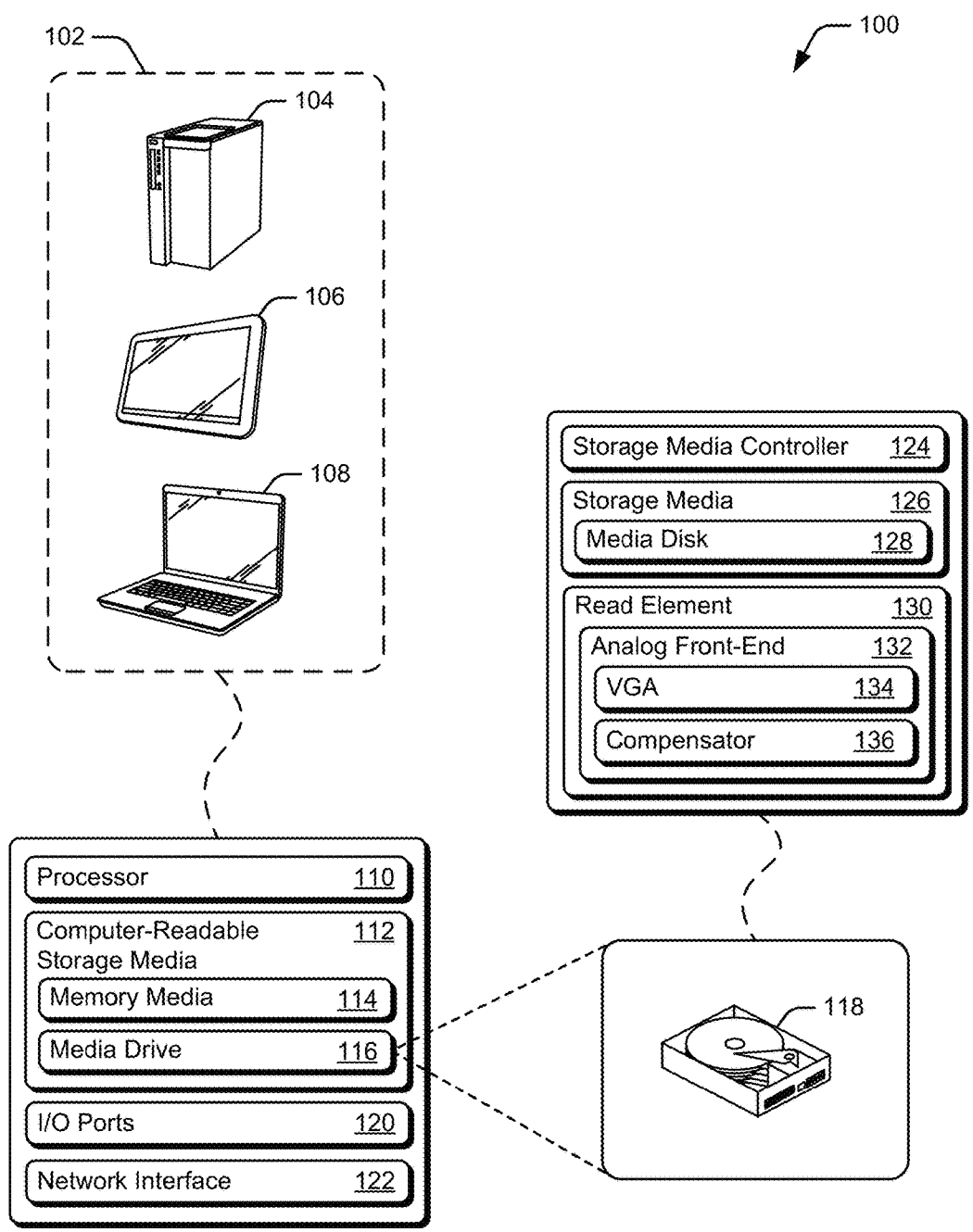
FIG. 1 illustrates an example operating environment having electronic devices in which a variable gain amplifiers are implemented in an embodiment of the disclosure.

Many computing and electronic devices store digital data using magnetic media, such as hard disk drives. Generally, the digital data is stored by encoding the digital data into a series of bits and then writing the encoded bits to a layer of magnetic material on one or more disks of magnetic media. To read the digital data from the magnetic media disk, a read-write head of the media drive pick-up or senses polarity variations from a surface of the magnetic media. Signals associated with sensing polarity of each section of the magnetic media, however, are often weak or vary greatly depending on characteristics of the magnetic media or a position of the read-write head relative the magnetic media disk. To address these issues, many media drives amplify the signal provided by the read-write head by varying levels before attempting to decode signal in order to determine the sequence of bits that were previously written to the magnetic media.

Varying amplification of these signals to provide signal levels suitable for decoding, however, typically introduces stability issues in amplifier circuits that necessitate the use of compensation capacitors to maintain stability. Although compensation capacitors can be added to maintain amplifier stability, a large number of capacitors and complex switching circuitry are typically needed to achieve compensation over wide ranges of gain adjustment. In other cases, a gain range of an amplifier is segmented into fewer, smaller gain ranges with each segmented gain range being associated with one compensation value. As amplifier gain transitions across boundaries of these segmented gain ranges, however, different capacitors have to be switched into a compensation circuit of the amplifier to maintain phase margin for stability.

When switching capacitors at a boundary of a gain range segment, bandwidth of the amplifier is also impacted, causing variations in propagation delay through the amplifier. In some cases, the variations in propagation delay are large enough to degrade system level performance of a media drive controller. Further, as capacitors are switched into the compensation circuit, the amplifier output signal is disturbed as the recently switched in capacitor charges up. These disturbances sometimes manifest as large glitches in the amplifier output signal, which disrupt operation of the amplifier's gain control. As such, compensating an amplifier with a network of switchable capacitors degrades amplifier performance and impairs operation of a media drive.

This disclosure describes a variable gain amplifier with gain-based compensation. In some embodiments, a variable gain amplifier includes a gain stage, an output stage, a compensation stage, and a capacitor disposed in a compensation path formed between an output of the compensation stage and an output of the gain stage. Compensation capacitance, such as that provided by the capacitor, is applied to the output of the gain stage to maintain stability of the amplifier at low levels of gain. The gain stage is configured to amplify a signal the output stage is configured to isolate the gain stage from feedback resistors or capacitive loading (e.g., a downstream filter) at an output of the variable gain amplifier. An output of the compensation stage is coupled to the capacitor, an effective capacitance of which can be adjusted by varying a gain of the compensation stage. In an embodiment, the compensation stage is implemented as a resistor divider such that a gain of the compensation stage is varied by altering a resistance of at least one variable resistor of the resistor divider. The adjusted or selectively configured effective capacitance of the capacitor is applied to the output of the gain stage for compensation. In an embodiment, a relationship of compensation stage gain and the amount of capacitance applied for compensation is inverse, such that an increase in gain decreases the compensation capacitance at the output of the gain stage. By adjusting gain of the compensation stage based on the gain configuration of the gain stage, the compensation capacitance applied to the output of the gain stage is varied continuously as output stage gain changes.

In some embodiments, a variable gain amplifier includes a gain stage, an output stage, a compensation stage, and a capacitor coupled between an output of the gain stage and an output of the compensation stage. A gain of the variable gain amplifier is configured based on a gain setting, such as to provide signals with an amplitude suitable for decoding. A gain of the compensation stage is also configured based on the gain setting to alter, via the gain of the compensation stage, an amount of capacitance of the capacitor that is applied to, or presented at, the output of the gain stage for compensation of the amplifier. Altering or varying the amount of capacitance applied to the output of the gain stage selectively compensates the variable gain amplifier, in an embodiment. By using the gain of the compensation stage, which can be controlled precisely, to adjust the amount of capacitance applied to the output of the gain stage, the compensation of the variable gain amplifier is adjusted continuously and smoothly with varying amounts of gain. For example, a gain setting may be coded using eight-bit resolution to provide not only 256 gain levels, but also 256 corresponding levels of compensation capacitance through compensation stage gain that is used to vary the amount of capacitance (compensation capacitance) applied to (or seen) at the output of the gain stage.

The following discussion describes in greater detail an operating environment, techniques that are employed in the operating environment, a System-on-Chip (SoC), and a communication transceiver in in accordance with an embodiment. In the context of the present disclosure, reference is made to the operating environment by way of example only.

Operating Environment

FIG. 1 illustrates an example operating environment 100 having a computing device 102, which is capable of communicating and/or storing data. Examples of the computing device 102 include a server 104, a tablet computer 106, or a laptop computer 108. Further examples of the computing device 102 include a desktop computer, a smart phone, a set-top-box, an embedded communication device, a data storage appliance (e.g., network-attached storage), a server blade, a vehicle-based computing system, and so on. The computing device 102 is capable of storing various data, such as databases, user data, multimedia, applications, operating systems, or the like. In various embodiments, one or more computing devices 102 are configured to provide remote data storage or services, such as cloud storage, archiving, backup, client services, records retention, and so on.

The computing device 102 includes at least one processor 110 and computer-readable storage media 112. The processor 110 includes any suitable type of processor, either single-core or multi-core, for executing instructions or commands of the operating system or applications of computing device 102. The computer-readable storage media 112 includes any type and/or combination of suitable storage media, such as memory media 114 and media drive 116. The memory media 114 is implemented as volatile or non-volatile memory, such as dynamic random-access memory (DRAM), read-only memory (ROM), or Flash memory that is useful to store data of applications, databases, and/or an operating system of computing device 102. The media drive 116 is configuration to store digital data and, in this example, includes hard-disk drive (HDD) 118, which is described in more detail below.

In the illustrated embodiment, the computing device 102 also includes I/O ports 120 or a network interface 122 for exchanging data. The I/O ports 120 allows the computing device 102 to interact with other devices and/or users. The I/O ports 120 include a combination of internal or external ports, such as audio inputs and outputs, universal serial bus (USB) ports, Serial ATA (SATA) ports, PCI-express based ports or card-slots, and/or other legacy ports. Various peripherals operatively coupled with the I/O ports 120, such as human-input devices (HIDs), external computer-readable storage media, or other peripherals.

The network interface 122 provides connectivity to one or more networks and other devices connected therewith. Data communicated over the network interface 122 is encrypted or unencrypted depending on the environment in which the computing device 102 is operating. In some embodiments, the network interface 122 includes wired interfaces, such as Ethernet or fiber optic interfaces for communicating over a local network, intranet, or the Internet. In other embodiments, the network interface 122 includes a wireless interface that facilitates communication over a wireless network, such as a wireless LAN, cellular network, and/or a wireless personal-area-network (WPAN).

The media drive 116, which is implemented as a hard-disk drive 118 in this example, includes a storage media controller 124 and storage media 126. Although not shown, the media drive 116 may be implemented as other configurations, such as a magnetic tape drive and other magnetic storage devices that access a similar storage media 126. Generally, the storage media controller 124 enables the computing device 102 to access contents of the storage media 126, such as an operating system, applications, or data for applications or other services. To facilitate access of the contents of the storage media 126, the storage media controller 124 reads data of the computing device 102 from, or write data of the computing device 102 to, the storage media 126.

The storage media 126 includes at least one media disk 128 for storing data of the computing device 102. Generally, the media disk 128 stores data of the computing device as a pattern of magnetically encoded bits that are written in a pattern of circular tracks (e.g., spiral or radial) across a magnetic media-coated surface of the media disk. To facilitate physical access of the data, the media drive 116 includes a write module (not shown) for writing data to the media disk 128 and a read element 130 for reading data from the media disk 128. To do so, the read element 130 converts the magnetic the digital data (e.g., encoded bits) stored on the media disk 128 to an electrical signal, which is then processed by the analog front-end 132. For example, the analog front-end 132 can normalize, filter, and digitize the electrical signal received from the read element 130. In this example, the analog front-end includes a variable gain amplifier 134 (variable gain amplifier 134) for amplifying electrical signals and a gain-based compensator 136 (compensator 136).

The implementations and uses of the variable gain amplifier 134 and compensator 136 vary, and are described throughout the disclosure.

Figure 2:
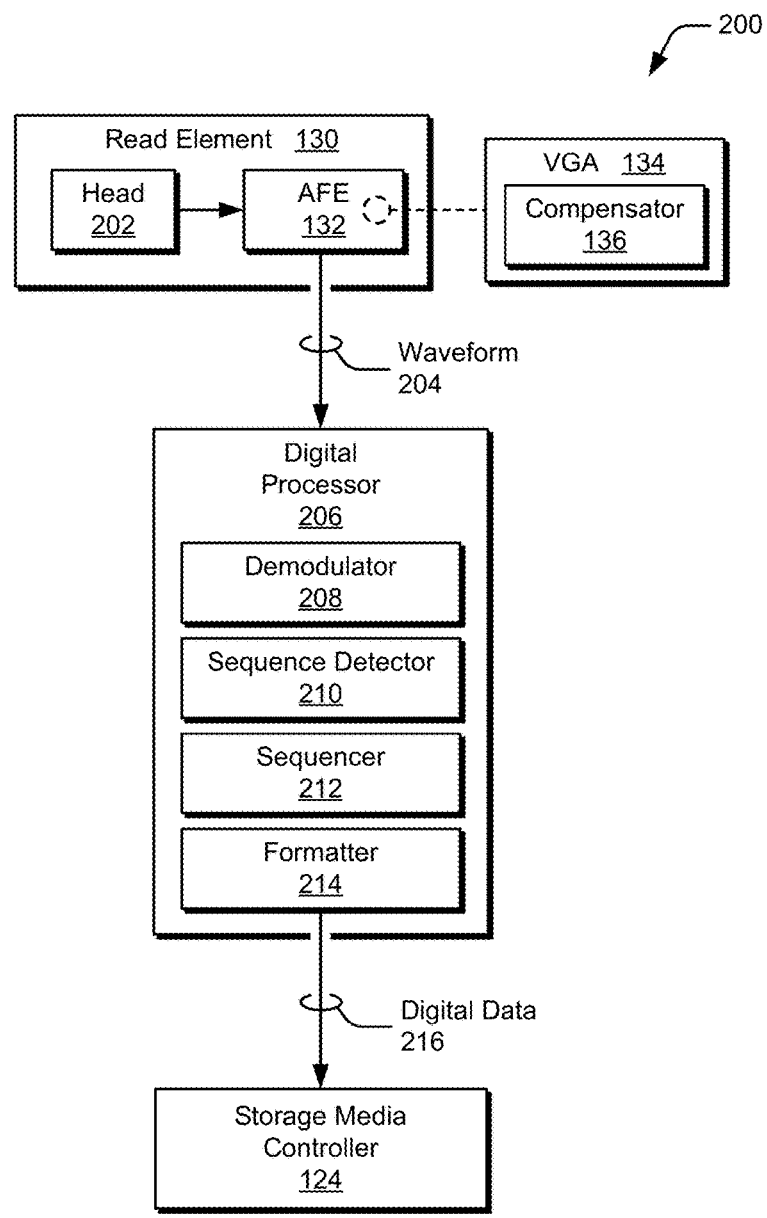
FIG. 2 illustrates an example configuration of components of the media drive seen in FIG. 1.

FIG. 2 generally illustrates an example configuration 200 of components of a media drive (e.g., media drive 118) in accordance with one or more embodiments. Generally, a read element 130 of a media drive 116 includes a head 202 and an analog front-end 132. When reading data from a media disk, the head 202 of the read element 130 picks up (e.g., detects) magnetic digital data stored on the media disk 128 converts the picked up digital data to an electrical signal. The analog front-end 132, which typically includes the variable gain amplifier 134 and compensator 136, may also include additional components, such as equalizers, filters, and analog-to-digital converters. Using these components, which are coupled together in an embodiment, as seen for example in FIG. 3, the analog front-end 132 normalizes, filters, and digitizes the electrical signal received from the head 202. As such, the head 202 and the analog front-end 132 enable the read element 130 to read one or more servo patterns on the media disk 128 and generate a waveform 204.

The digital processor 206 includes various data detection components such as a demodulator 208, a sequence detector 210, a sequencer 212, a formatter 214, or the like, coupled together in an embodiment as seen in FIG. 2. Generally, the sequence detector 210 or synchronous detector (not shown) demodulate the waveform 204 to produce digital data 216, such as servo data that corresponds to the digital data stored on media disk 128. The sequencer 212 and formatter 214 prepare the digital data 216 for transmission over a data interface to the storage media controller 124. Further, the storage media controller 124 transmits the digital data 216 to a host or other requesting device.

Figure 3:
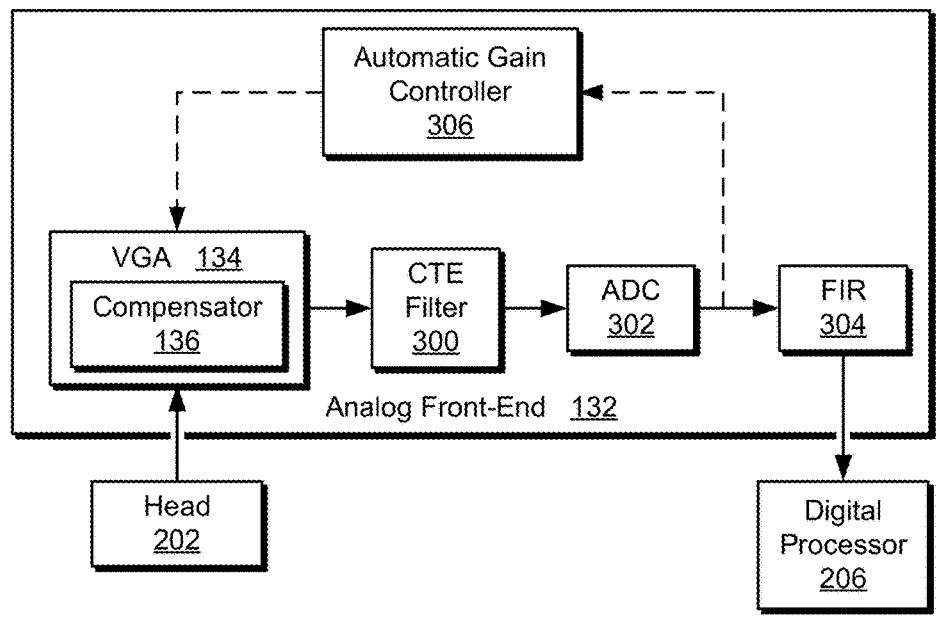
FIG. 3 illustrates an example configuration of components of the analog front-end seen in FIG. 2.

FIG. 3 generally illustrates an example configuration of an analog front-end 132. In this example, the variable gain amplifier 134 is coupled to the head 202 of a read element and receives an input signal. Generally, a signal path of the analog front-end 132 begins with the variable gain amplifier 134 configured to amplify an analog signal received from head 202 and then proceeds to a continuous time filter 300 (CTF filter 300) and analog-to-digital converter 302 (ADC 302). The CTF filter is configured to filter noise present in the amplified signal and pre-equalize the analog signal for the analog-to-digital converter 302. Following conversion of the analog signal into a digital signal by the analog-to-digital converter 302, the digital signal proceeds to a finite impulse response filter 304 (FIR 304) configured to equalize the digital signal. Subsequent to equalization, the digital signal is transmitted to the digital processor 206 for further processing.

The analog front-end 132 includes a feedback path between the analog-to-digital controller 302 and the variable gain amplifier 134. An automatic gain controller 306 is disposed in the feedback loop between the analog-to-digital converter 302 and the variable gain amplifier 134, in an embodiment, and is configured to monitor an output of the variable gain amplifier 134 at an output of the variable gain amplifier 134 or at another point in the signal processing path. In this example, the automatic gain controller 306 monitors an output or output value of the analog-to-digital converter 302. Based on the output or output value of the analog-to-digital converter 302, the automatic gain controller 306 adjusts a gain of the variable gain amplifier 134. In some cases, the automatic gain controller 306 adjusts the gain of the variable gain amplifier 134 based on parameters of the analog-to-digital converter 302, such as an input range or dynamic range. For example, in an embodiment, the automatic gain controller 306 adjusts the gain of the variable gain amplifier 134 such that a peak-to-peak amplitude of an amplified signal is maximized with respect to the dynamic range of the analog-to-digital converter 302.

In some embodiments, the automatic gain controller 306 adjusts the gain of the variable gain amplifier 134 by determining a digital gain code that corresponds with a desired amount of gain to be provided by the variable gain amplifier with respect to a signal portion corresponding to a single bit or to a plurality of bits stored in the memory media 114. The digital gain code includes any suitable number of bits, such as an 8 bit value that provides 256 different digital gain codes by which to set the gain of the variable gain amplifier 134. The digital gain code is then converted, by the automatic gain controller 306 or another digital-to-analog converter (not shown), to provide an analog gain control signal.

The automatic gain controller 306 also uses the digital gain codes or analog gain control signal to adjust a compensation capacitance of the variable gain amplifier 134, such as through the compensator 136. In some embodiments, the compensator 136 includes a compensation capacitor and an adjustable gain block or resistive network by which a level of compensation capacitance can be adjusted, coupled together in embodiments shown in FIG. 4 or FIG. 5. In addition to configuring a gain of the variable gain amplifier 134, the analog control signal is applied to a gain adjustment block or resistor network of the compensator 136 in some embodiments to adjust an amount or level of compensation capacitance of the variable gain amplifier 134 based on the gain (or gain setting) of the variable gain amplifier 134. Adjusting the gain of the gain adjustment block or resistor network is effective to alter an amount of capacitance of the compensation capacitor by which a gain stage of the variable gain amplifier 134 is compensated. Accordingly, the compensator 136 applies, based on amplifier gain, varying amounts of compensation capacitance to the gain stage to compensate the variable gain amplifier 134.

Figure 4:
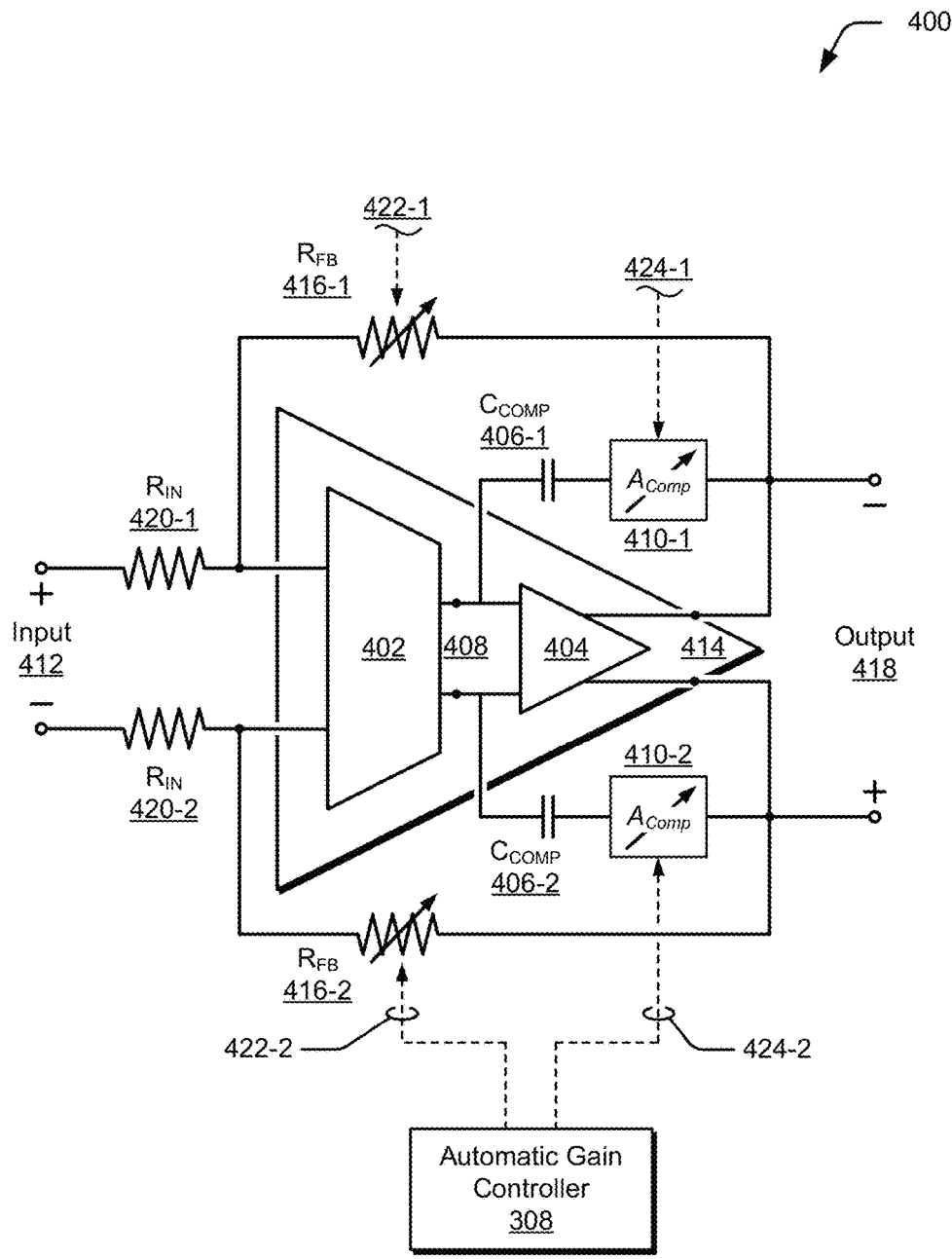
FIG. 4 illustrates an example configuration of the variable gain amplifier seen in FIG. 3.

FIG. 4 illustrates an example embodiment of a variable gain amplifier 400, which is an embodiment of the variable gain amplifier 134 of the analog front-end 132 seen in FIG. 3. In this example, the variable gain amplifier 400 includes a gain stage 402, an output stage 404, and a compensation capacitor 406. In some embodiments, the compensation capacitor 406 is disposed in a compensation path formed between an output 408 of the gain stage 402 and a compensation stage 410, which is selectably configurable to vary or adjust gain of the compensation path. The gain stage 402 is configured to amplify signals received at an input 412 of the variable gain amplifier 400. The output stage 404 is configured to drive, at an output 414 of the output stage 404, feedback resistors 416 and output capacitors (not shown) coupled to an output 418 of the variable gain amplifier 400. The compensation stage 410 (e.g., an adjustable gain block) is configured to vary, based on a gain of the variable gain amplifier 400, amounts of capacitance of the compensation capacitor 406 presented at the output 408 of the gain stage 402 for compensation to maintain stability of the variable gain amplifier 400. Here, the variable gain amplifier 400 is implemented as a differential amplifier and similar names or references designators (e.g., −1 or −2) are used when referring to similar entities on positive or negative signal paths.

Generally, a gain of the variable gain amplifier 400 is adjusted based on resistance provided by two or more input resistors 420 at the input 412 of the variable gain amplifier 400 and resistance of two or more feedback resistors 416. As shown in Equation 1, the gain of the variable gain amplifier 400 (e.g., overall closed loop gain) is provided by a ratio of resistance provided by the feedback resistors 416 ($R_{fb}$) divided a resistance provided by the input resistors 420 ($R_{in}$).

Gain of the Variable Gain Amplifier     Equation 1

$$\text{Gain} = -\frac{R_{fb}}{R_{in}}$$

In an embodiment, the two or more feedback resistors 416 are variable resistors providing a selectably variable resistance based on a gain control signal 422 provided by the automatic gain controller 306. In this case, the feedback resistors 416 are disposed in a feedback configuration between the output 418 of the variable gain amplifier 400 and the input 412 to the gain stage 402, upstream of the input resistors 420. In an embodiment, as seen in FIG. 4, the feedback resistors 416 are also coupled to the output 414 of the output stage 404, which is configured to drive the output 418 of the variable gain amplifier 400. Here, note that the output 408 of the gain stage 402 is connected to an input of the output stage 404, and not connected directly to the output 418 of the variable gain amplifier 400. The output 408 of the gain stage 402 is configured with high impedance and includes a dominant pole for stability of the variable gain amplifier 400. As such, the gain stage 402 is isolated from resistive or capacitive loading (e.g., a CTF filter) at the output 418 of the variable gain amplifier 400 and is a suitable point for an application of capacitance via compensation capacitors 406 to maintain circuit stability.

The variable gain amplifier 400 also includes an instance of a gain-based compensator 136, which in this example is shown as the compensation stages 410 disposed in a compensation path formed between the output 414 of the output stage 404 and the output 408 of the gain stage 402. In an embodiment, the compensation stages 410 are implemented as respective adjustable gain blocks or resistor networks that includes at least one variable resistor for gain variation. The compensation capacitors 406 are also disposed in the compensation path, being coupled between respective outputs of the compensation stages 410 and the output 408 of the gain stage 402, which is a dominant pole for stability of the amplifier. In an embodiment, a gain of the compensation stage 410, $A_{comp}$ as seen in FIG. 4, is varied to change an amount of capacitance of the compensation capacitor 406 that is applied to, or seen at, the output 408 of the gain stage 402 effective to compensate the variable gain amplifier 400. To control gain of the compensation stages 410, and thus an amount or level of compensation provided by the compensation capacitors 406, the automatic gain controller 306 applies gain control signals 424 to the compensation stages 410. As noted, the gain control signals 420 and 424 are provided based on a high resolution bit value such that the gain of the variable gain amplifier 400, and an amount of compensation capacitance at the output 408 of the gain stage 402, is precisely controllable based on a gain setting or digital gain code of the variable gain amplifier 400. In some embodiments, the gain controls signals 422 applied to the feedback resistors 416 and the gain control signals 424 applied to the compensation stages 410 are the same signal or have a same voltage.

In contrast with conventional capacitor switching compensation that is discontinuous, an effective capacitance of the compensation capacitor 406 applied to, or presented at, the output 408 of the gain stage 402 is varied smoothly or gradually through adjustment provided based on gain settings of the variable gain amplifier 400. By varying the effective capacitance of the compensation capacitor 406 smoothly or gradually, compensation capacitance of the amplifier 400 is adjustable over a wide range of gain values without large deviations or jumps in capacitance, which cause delay issues in amplifiers and analog-to-digital sampling timing loops. Although not shown in this example, in various embodiments the compensation stages 406 include adjustable gain blocks, variable resistors, transistors, or resistive networks disposed between an output 414 of the output stage 404 and compensation capacitor 406.

Generally, the amount, portion, or level of capacitance of the compensation capacitor 406 that is presented at the output 408 of the gain stage 402, or the effective capacitance of a compensation circuit formed by the output stage 404, compensation capacitors 406, and the compensation stage 410, is approximated as shown in Equation 2. Here, the effective capacitance ($C_{effective}$) of the compensation capacitor 406 that is presented at the output 408 of the gain stage 402 as approximately a capacitance value ($C_{comp}$) of the compensation capacitor 406 multiplied by a scaling factor of one minus the effective gain of the compensation stage ($A_{Comp}$). The effective gain ($A_{Comp}$) of the compensation stage 410 also includes a gain of the output stage 404 ($A_{out}$), which is approximately 1 V/V and therefore omitted from Equation 2.

$$C_{effective} \sim C_{comp}(1 - A_{Comp})$$

Equation 2: Effective Capacitance based on Gain of the Compensation Stage

Here, note that by varying a gain (e.g., $A_{comp}$ in V/V) of the compensation stage 406 from approximately zero to approximately one, the effective capacitance of the compensation capacitor 406 that is presented at the output 408 of the gain stage for compensation of the variable gain amplifier 400 is adjusted precisely and/or smoothly. In other words, an amount of compensation capacitance applied to the output 408 of the gain stage 402, and thus the dominant pole for amplifier stability, is adjusted smoothly as the gain control signals 422 and 424 change, thereby compensating the variable gain amplifier 400 across a wide range of gain values or gain settings. By so doing, respective amounts of compensation capacitance are applied based on an overall gain of the variable gain amplifier 400 such that bandwidth of the amplifier 400 is not impaired by over overcompensation, as is typically associated with the switching discrete capacitors for compensation.

Figure 5:
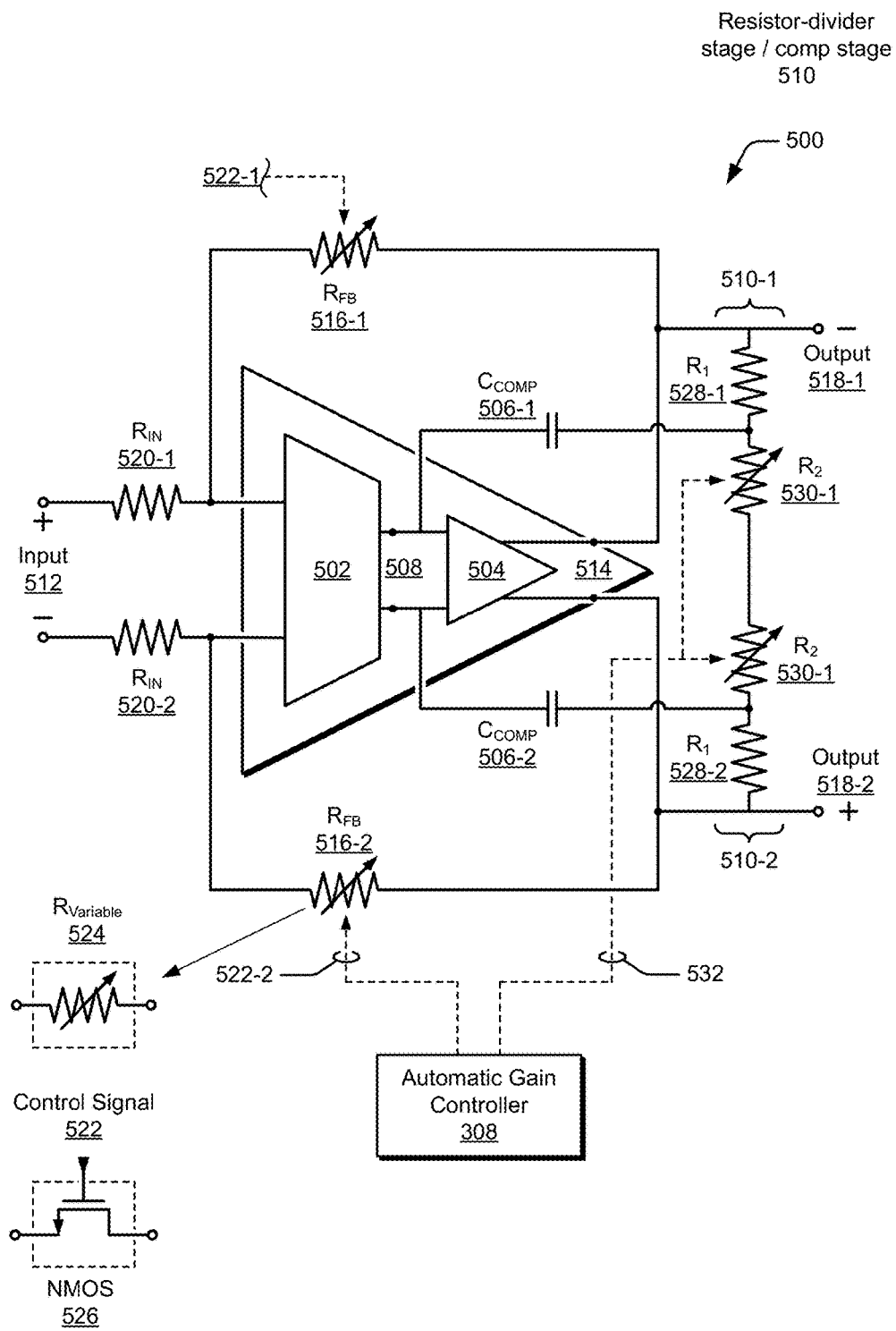
FIG. 5 illustrates another example configuration of the variable gain amplifier seen in FIG. 3 with resistor-based compensation adjustment.

FIG. 5 illustrates another example embodiment of a variable gain amplifier 500, which is an embodiment of the variable gain amplifier 134 of the analog front-end 132 seen in FIG. 3. In this example, the variable gain amplifier 500 includes a gain stage 502, an output stage 504, compensation capacitors 506, and compensation stages 510, which are implemented in this embodiment at a resistor-divider stage. In some embodiments, the compensation capacitor 506 is disposed in a compensation path formed between an output 508 of the gain stage 502 and a compensation stage 510, which is selectably configurable to vary or adjust gain of the compensation path. The gain stage 502 is configured to amplify signals received at an input 512 of the variable gain amplifier 500. The output stage 504 is configured to drive, at an output 514 of the output stage 504, feedback resistors 516 and output capacitors (not shown) coupled to an output 518 of the variable gain amplifier 500. The compensation stage 510 (e.g., the resistor-divider stage) is configured to vary, based on a gain of the variable gain amplifier 500, amounts of capacitance of the compensation capacitor 506 presented at the output 508 of the gain stage 502 for compensation to maintain stability of the variable gain amplifier 500. Here, the variable gain amplifier 500 is implemented as a differential amplifier and similar names or references designators (e.g., -1 or -2) are used when referring to similar entities on positive or negative signal paths.

Generally, a gain of the variable gain amplifier is adjusted based on resistance provided by two or more of input resistors 520 at the input 512 of the variable gain amplifier 500 and resistance of two or more variable resistance feedback resistors 516. (e.g., Equation 1). In an embodiment, the two or more feedback resistors 516 are variable resistors providing a selectably variable resistance based on a gain control signal 522 provided by the automatic gain controller 306. By way of example, consider an embodiment of a variable resistor 524, which is implemented as a metal-oxide-semiconductor field-effect transistor (MOSFET), such as n-channel MOSFET 526 or NMOS 526. The variable resistor 524 is an embodiment of the feedback resistors 514 and other variable resistors shown in FIG. 4 or FIG. 5, such as variable resistors of a resistor-divider stage. In various embodiments, a variable resistor is implemented with a MOSFET, such as by using an on-resistance ($R_{DS}$) of an NMOS or PMOS transistor. The variable resistor has a variable resistance that is adjustable based on the application of a voltage or signal at gate of the MOS transistor. As shown in FIG. 5, the gain control signal 522 applied to a gate of the NMOS 526 is effective to alter or program a resistance value of a variable resistor 524. In this case, the feedback resistors 516 are disposed in a feedback configuration between an output 518 of the variable gain amplifier 500 and the input 512 to the gain stage 502, upstream of the input resistors 512. In an embodiment, as seen in FIG. 5, the feedback resistors 516 are also coupled to an output 514 of the output stage 504, which is configured to drive the output 518 of the variable gain amplifier 500.

The variable gain amplifier 500 also includes an instance of a gain-based compensator 136, which in this example includes the compensation capacitors 506 and resistor-divider stages 510. The compensation capacitor 506 is coupled between an output of the resistor-divider stage 510 and the output 508 of the gain stage 502, which is a dominant pole for stability of the amplifier 500. At low gain levels, approximately at one V/V or less, phase margin of the variable gain amplifier 500 is reduced such that an amplified signal provided at the output 518 of the variable gain amplifier 500 may oscillate without an increase in compensation capacitance at the output 508 of the gain stage 502. In an embodiment, the resistor-divider stages include first resistors 528 and variable resistors 530, which form a resistor divider for adjusting or scaling a gain ($A_{out}$) of the output stage 504 of the variable gain amplifier 500. Adjusting or varying the gain of the output stage 504 in turn alters an amount of capacitance of the compensation capacitor that is presented at, or applied to, the output 508 of the gain stage 502 for circuit compensation of the variable gain amplifier 500. Generally, the effective capacitance of a compensation circuit formed by the output stage 504, the compensation capacitor 506, and resistor-divider stages 510 is approximated as shown in Equation 3. Here, an effective capacitance ($C_{effective}$) of the compensation capacitor 506 is approximately a capacitance ($C_{comp}$) of the compensation capacitor 506 multiplied by a scaling factor of one minus the gain ($A_{out}$) of the output stage 404 times a ratio of respective resistances of the second resistor ($R_2$) divided by the sum of the first and second resistors ($R_1+R_2$).

Effective Capacitance with Restive Network    Equation 3

$$C_{eff} = C_{comp}\left(1 - A_{out} * \frac{R_2}{R_1 + R_2}\right)$$

As shown by Equation 3, varying a gain of the resistor-divider stage 510 from approximately zero to approximately one, the effective capacitance of the compensation capacitor 506 by which the output 510 of the gain stage 502 is compensated is adjustable from approximately a value of $C_{comp}$ (e.g. for low gain values) to no compensation (e.g., for high gain values). In some embodiments, the automatic gain controller 306 controls the feedback resistors 516 via control signals 522 to adjust the gain of the variable gain amplifier 500. The automatic gain controller 306 also controls the second resistors 530 via a control signal 532, which is the same as the gain control signal 522, in an embodiment. With precise digital gain codes (e.g., 8-bit values) of the automatic gain controller 306, a resistance provided by the second resistor 530 can be adjusted or varied in small increments (e.g., $1/256^{th}$ of resistance range). As such and given Equation 3, the automatic gain controller 306 can also adjust the gain of the resistor-divider stage 510 and thus an effective capacitance of the compensation capacitor 506 in similar increments of precise adjustment. In an embodiment, the automatic gain controller 306 applies the same gain control signals 522 and 532 to the feedback resistors 516 and the second resistors 530. This is effective to adjust, based on a gain of the variable gain amplifier 500, an effective capacitance of the compensation capacitor 506 that is applied to the output 508 of the gain stage 502 for compensation. In combination with the precise resolution of the digital gain codes used to generate the gain control signals, the amount of capacitance of the compensation capacitor 506 that is applied for compensation precisely tracks the gain of the variable gain amplifier 500 such that the variable gain amplifier 500 is not overcompensated or subjected to large jumps in compensation capacitance.

Techniques of Gain-Based Compensation

The following discussion describes techniques for gain-based compensation in a variable gain amplifier, which are implemented in various embodiments of analog front-ends, analog-to-digital converters, communication transceivers, or the like, in accordance with various embodiments. These techniques are implemented the environments and entities described herein, such as the analog front-end 132, variable gain amplifier 134, compensator 136, and/or automatic gain controller 306. These techniques include methods illustrated in FIGS. 6, 8, and 9, each of which is shown as a set of operations performed by one or more entities.

Figure 6:
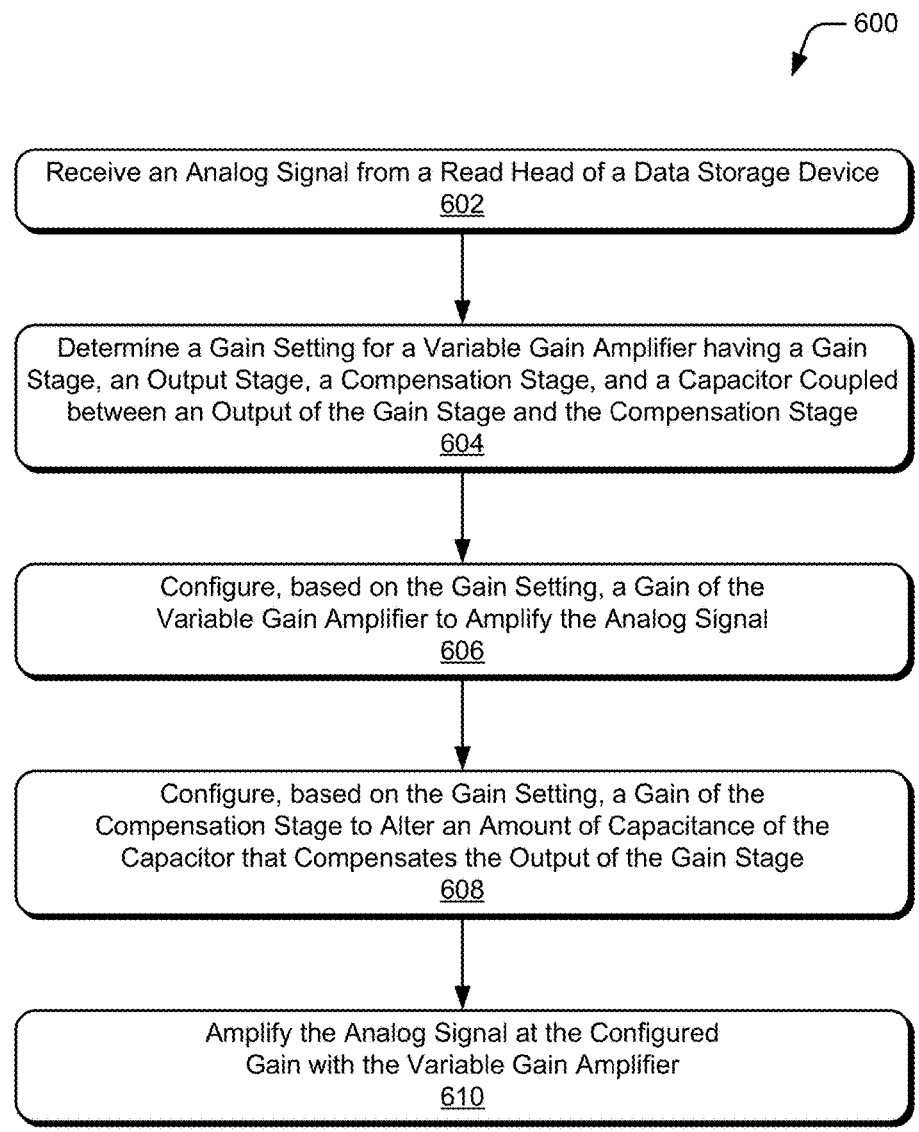
FIG. 6 illustrates an example method for compensating a gain stage of a variable gain amplifier that is implemented by embodiments of the disclosure.

FIG. 6 depicts an example method 600 for compensating a gain stage of a variable gain amplifier, including operations implemented with or performed by variable gain amplifier 134, compensator 136, and/or automatic gain controller 306.

At 602, an analog front-end receives an analog read signal from a read head of a data storage device. The analog signal is generated by the analog read head responsive to sensing digital data encoded on a magnetic media disk of the data storage device. The analog signal is received by a variable gain amplifier of the analog front-end, which is configured to amplify the analog signal for subsequent signal processing.

At 604, a gain setting for a variable gain amplifier of the analog front-end is determined by an automatic gain controller. The automatic gain controller is disposed in a feedback loop formed between the variable gain amplifier and a component downstream of the variable gain amplifier, such as an analog-to-digital converter. The variable gain amplifier, embodiments, includes a gain stage, an output stage, a compensation stage (e.g., resistor-divider stage), and a capacitor disposed in a compensation path formed between an output of the compensation stage and an output of the gain stage. In some cases, the gain for the variable gain amplifier is determined based on an input range or dynamic range of a downstream signal processing component, such as an analog-to-digital converter, filter, another amplifier, or the like.

At 606, a gain of the variable gain amplifier is configured responsively to the gain setting applied by the automatic gain controller. As noted, the gain setting is a target gain setting for the variable amplifier based on feedback provided by a downstream signal processing component, in an embodiment. Configuring the gain of the variable gain amplifier includes adjusting or varying a resistance of a resistor coupled to or within a feedback path of the variable gain amplifier. In some embodiments, a control voltage of a MOSFET-based variable resistor is increased or decreased responsive to application of a gain control signal to adjust the resistance of the variable resistor.

At 608, a gain of the compensation stage of the variable gain amplifier is configured responsive to the gain setting applied by the automatic gain controller. Configuring the gain of the compensation stage, such as a resistor network, alters an amount of capacitance of the capacitor in the compensation path that is applied to the output of the gain stage. This is effective to compensate the variable gain amplifier, such that the variable gain amplifier does not oscillate due to instability at low levels of gain. In some embodiments, a precision of the gain setting or a gain control signal (e.g., 8-bit resolution) enables precise gain control of the gain or ratio of the compensation stage, which in turn permits precise adjustment of the compensation capacitance (e.g., $\frac{1}{256}^{th}$ increments or levels). In such cases, with 256 increments of gain and 256 similar increments of compensation capacitance, the automatic gain controller can make one-to-one adjusts of compensation as gain changes effective to provide continuous or gradual compensation of the variable gain amplifier over a wide range of gain settings.

Figure 7:
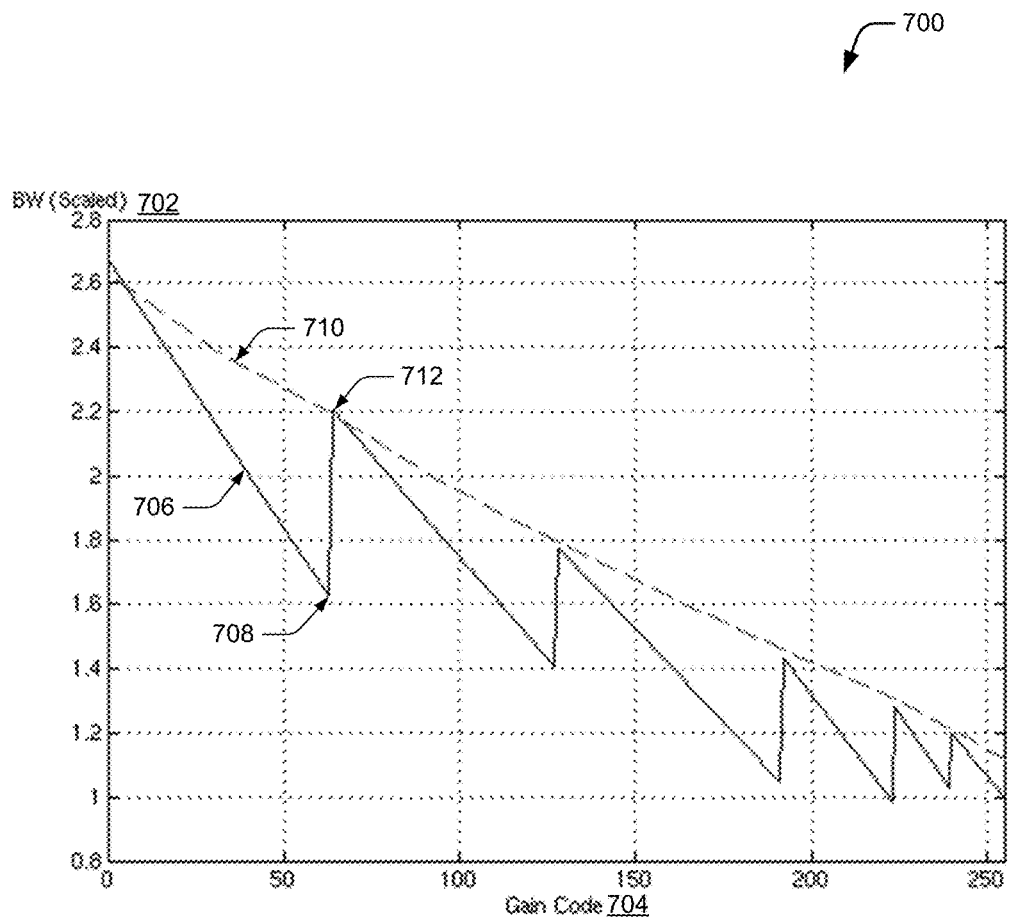
FIG. 7 includes a graph of example bandwidth performance for a variable gain amplifier that implements the method of FIG. 6.

By way of example, consider FIG. 7 which includes a graph 700 of example bandwidth performance for a variable gain amplifier with gain-based compensation. In the graph 700, bandwidth 702 of a variable gain amplifier is shown with respect to a range of gain codes 704 (e.g., 256 digital gain codes) for setting gain of a variable gain amplifier. As shown at 706, a conventional compensation scheme that comprises switching discrete capacitors for six segments of gain range causes relatively large stepwise drops in bandwidth 702 at boundaries of each gain range. Without sufficient compensation capacitance, an amplifier circuit becomes unstable and oscillates at low gain ranges. As such, the discrete capacitors of the conventional scheme are sized for worst case, or lowest gain, which results in overcompensation toward the higher gain boundaries of each gain range. An example of this is illustrated at 708 where a discontinuous drop in bandwidth occurs when a next capacitor is switched in a conventional compensation circuit to compensate for an adjacent gain range (e.g., moving right to left at 708).

In contrast, as shown at 710 (dashed line), embodiments of variable gain amplifiers with gain-based compensation have a gradual or smooth bandwidth 702 profile across almost all gain codes. Because the gain codes are used to configure a gain of a compensation stage or resistor-divider stage, and thus compensation capacitance of the variable gain amplifier, the compensation of the amplifier is adjusted continuously and precisely as gain codes change to configure gain of the variable gain amplifier. Using the gain of the compensation stage or resistor-divider stage also provides an approximately linear relationship of capacitance variability (not discrete), which results in the smooth bandwidth profile 710. As shown at 712, bandwidth of a variable gain amplifier with gain-based compensation is continuous and, on average, higher than that of conventionally compensated amplifiers.

Referring back to FIG. 6, at 610, the signal is amplified by the variable gain amplifier at the gain responsive to the gain setting. In an embodiment, the configured gain of the variable gain amplifier is selected such that the amplified signal has a maximum amplitude or peak-to-peak voltage relative an input range or dynamic range of a signal processing component coupled downstream of the variable gain amplifier, such as a CTF filter, equalizer, or analog-to-digital converter.

Figure 8:
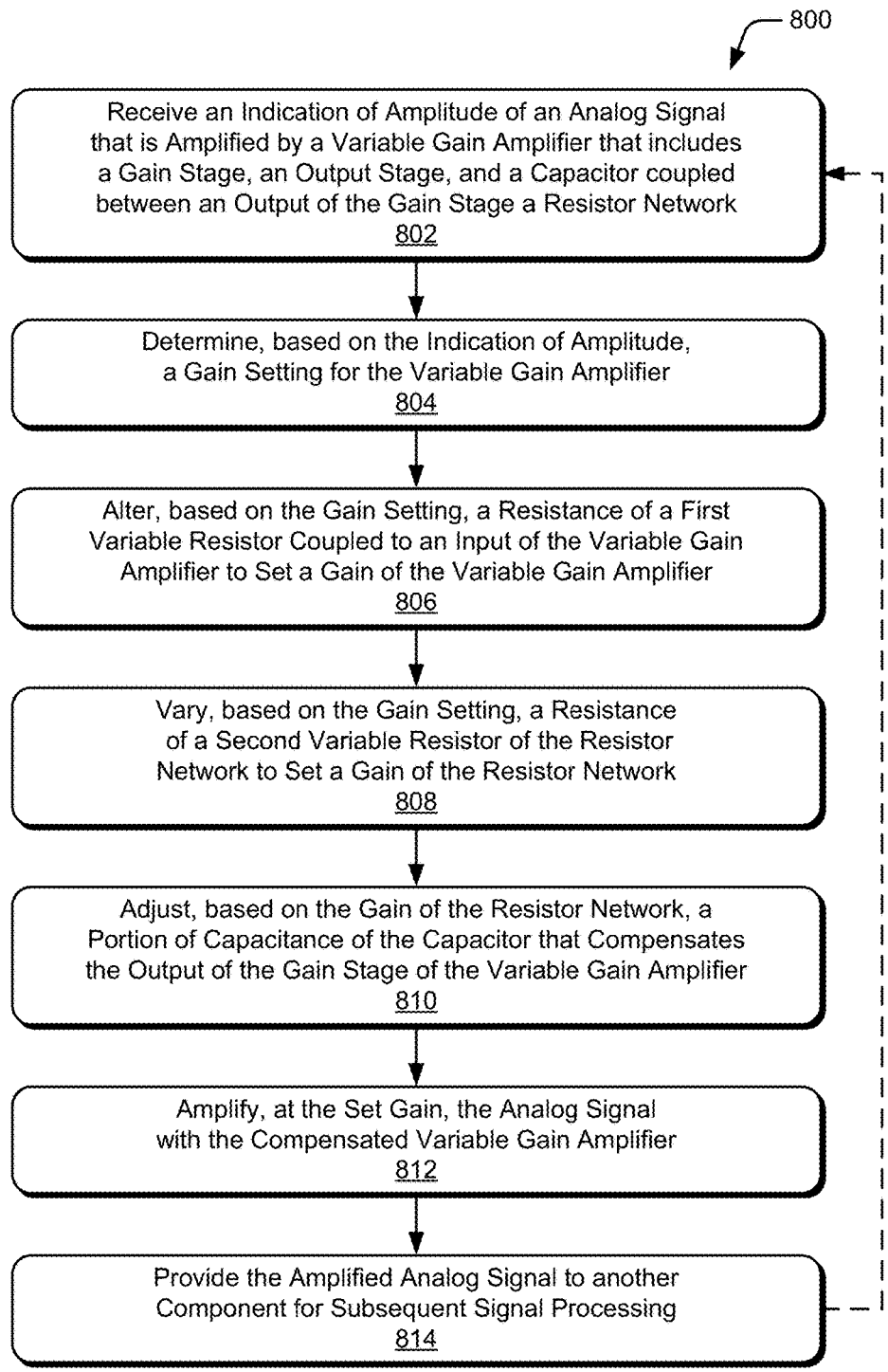
FIG. 8 illustrates an example method for altering respective resistances of variable resistors of the variable gain amplifier seen in FIG. 5.

FIG. 8 depicts an example method 800 for altering respective resistances of variable resistors to set a gain and to compensate a variable gain amplifier, including operations implemented with or performed by the variable gain amplifier 134, compensator 136, and/or automatic gain controller 306.

At 802, an indication of amplitude of a signal that is amplified by a variable gain amplifier is received by an automatic gain controller. The variable gain amplifier includes a gain stage, an output stage, and a capacitor coupled between an output of the gain stage and a resistor network. In an embodiment, the variable gain amplifier and automatic gain controller are implemented as part of an analog front-end of a media drive. The indication is received from a component that is downstream of the amplifier in a signal processing path, such as for example a CTF filter, an analog-to-digital converter, or another amplifier. The indication of amplitude is received as relative indication or an absolute indication of amplitude. In an embodiment, the indication indicates a difference in signal amplitude and an input specification of a component, such as dynamic range or a maximum input amplitude of an analog-to-digital converter.

At 804, the automatic gain controller determines, based on the indication of amplitude, a gain setting for the variable gain amplifier. In an embodiment, the gain setting is determined by referencing, based on the indication of amplitude, a look-up table of gain codes associated with the variable gain amplifier. The gain is also determinable based on an amplitude of a signal that is received at an input to the variable gain amplifier.

At 806, the automatic gain controller alters a resistance of a first variable resistor based on the gain setting. The first resistor is disposed in a feedback loop formed between an output of the variable analog amplifier and an input of the variable gain amplifier. As such, altering the resistance of the first variable resistor effectively sets a gain of the variable gain amplifier. In an embodiment, the variable resistor comprises a MOSFET based variable resistor which exhibits a level of resistance that is responsive to a voltage level applied, by the automatic gain controller, to a gate of the MOSFET.

At 808, the automatic gain controller alters a resistance of a second variable resistor based on the gain setting to set a gain of the resistor network (e.g., compensation stage) of the variable gain amplifier. The capacitor of the variable gain amplifier is disposed in a compensation path formed between the output of the gain stage and an output of the resistor network. The second variable resistor is at least one variable resistor of the resistor network, a gain of which varies based on a resistance provided by the second variable resistor. As such, altering the resistance of the second variable resistor adjusts an effective capacitance or an amount of capacitance of a capacitor that is presented or applied in the compensation path of the variable gain amplifier. In an embodiment, altering the resistance of the second variable resistor includes varying a control voltage applied to a gate of a MOSFET-based variable resistor.

At 810, based on the gain of the compensation stage, a portion of capacitance of the capacitor in the compensation path is applied to an output of the gain stage to compensate the variable gain amplifier. The portion of capacitance corresponds to the gain setting by which the gain of the variable gain amplifier is configured, such that the variable gain amplifier is compensated for a particular amount of gain or a particular gain code by the application of the portion of capacitance.

At 812, the compensated variable gain amplifier amplifies an input signal at the set gain by the first variable resistor. For example, the gain of the variable gain amplifier in some embodiments ranges from range from approximately one (V/V) to slightly less than one (V/V), or close to zero. In an embodiment, the input signal includes an analog signal read from a media disk or a wireless signal received via an antenna.

At 814, the amplified signal is provided by the variable gain amplifier to another component for subsequent signal processing. In an embodiment, the other component includes another component of an analog front-end, such as a CTF filter, analog-to-digital converter, or signal equalizer. From operation 812, the method 800 can return to operation 802 to repeat one or more operations of method 800. For example, the automatic gain controller 306 receives an updated indication of amplitude from the analog-to-digital converter 302. In an embodiment, the operations of 800 are implemented or repeated as part of an automatic gain control algorithm to adjust the gain and compensation of an amplifier with gain-based compensation.

Figure 9:
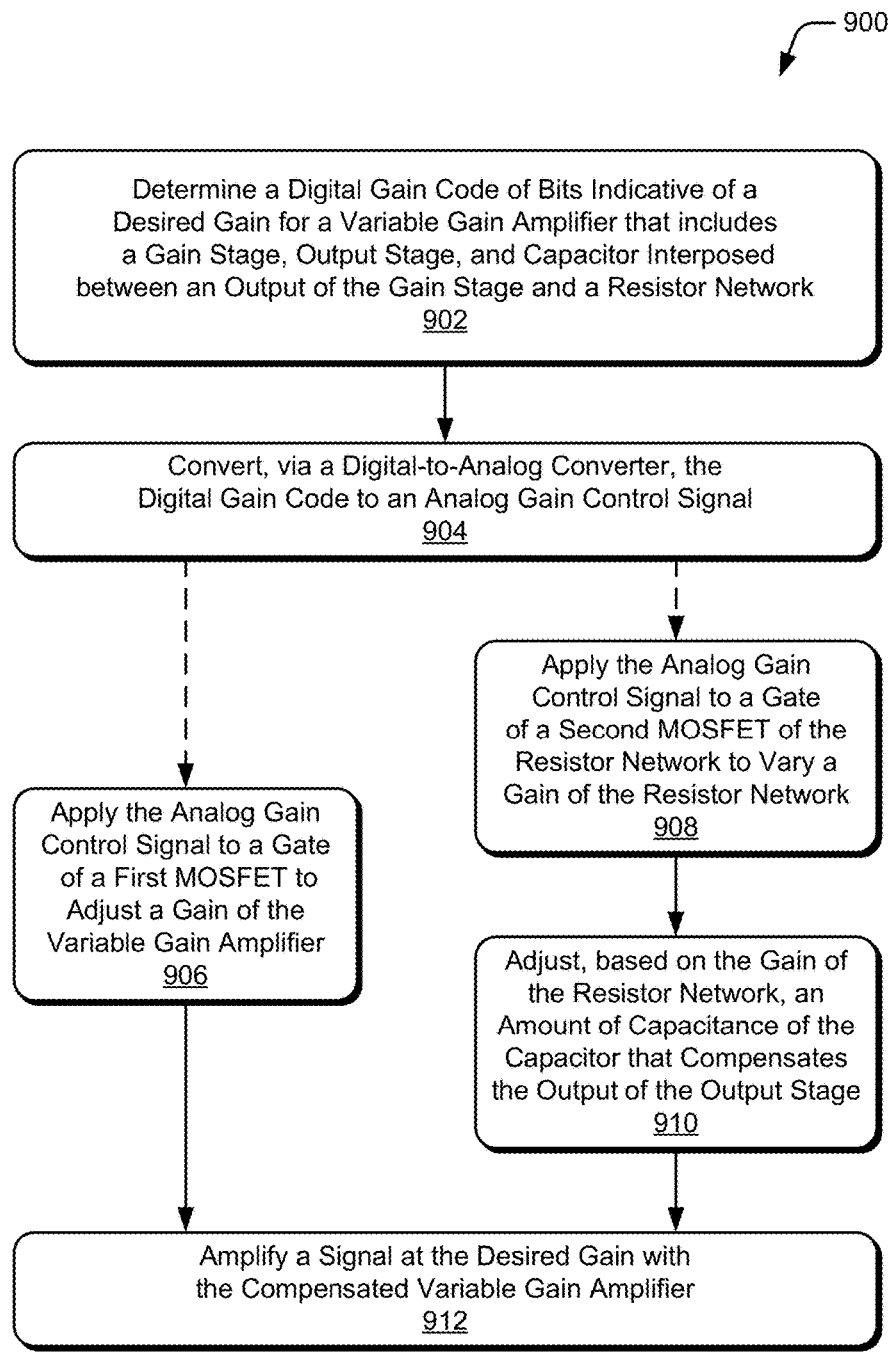
FIG. 9 illustrates an example method for using gain codes to configure compensation of a variable gain amplifier seen in FIG. 4 or FIG. 5.

FIG. 9 depicts an example method 900 for determining and using gain codes to configure a gain and compensation of a variable gain amplifier, including operations implemented with or performed by the variable gain amplifier 134, compensator 136, and/or automatic gain controller 306.

At 902, an automatic gain controller determines a digital gain code for a variable gain amplifier. The automatic gain controller is disposed in a feedback loop formed between a variable gain amplifier and a downstream signal components, such as an analog-to-digital converter. In an embodiment, the digital gain code includes bits indicative of a gain for the variable gain amplifier. In some cases, a look-up table associated with the variable gain amplifier is referenced to determine the appropriate gain code that corresponds to a target gain level associated with downstream signal processing components.

At 904, the automatic gain controller converts the digital gain code an analog gain control signal. The automatic gain controller uses a digital-to-analog converter to provide the analog control signal. In an embodiment, the analog gain control signal is converted or generated with a precision ($1/256^{th}$ levels) that corresponds to a bit resolution of the digital gain code (e.g., eight bit resolution). In some cases, one analog gain control signal is generated to control a gain stage and a compensation stage (e.g., resistor-divider stage) of an amplifier. In other cases, separate respective analog control signals are generated for the gain stage and compensation stage of the variable gain amplifier.

At 906, the automatic gain controller applies the analog gain control signal to a gate of a first metal-oxide-semiconductor field-effect transistor (MOSFET). In an embodiment, the first MOSFET is implemented as a resistor disposed in a feedback loop formed between an output of the variable gain amplifier and an input of a gain stage of the amplifier. Application of the analog gain control signal is effective to adjust a gain of the variable gain amplifier.

At 908, the automatic gain controller applies the analog gain control signal to a gate of a second MOSFET to alter a resistance provided by the second MOSFET. The second MOSFET is disposed in a resistor network such that altering the resistance provided by the second MOSFET varies a gain or ratio of the resistor network. In an embodiment, a capacitor of the variable gain amplifier that provides compensation for the variable gain amplifier is disposed between an output of the resistor network and an output of a gain stage of the variable gain amplifier.

At 910, an amount of capacitance of the capacitor that compensates the output stage of the variable gain amplifier is adjusted based on the gain of the resistor network. In an embodiment, configuring the gain of the resistor network governs an amount of capacitance of the compensation capacitor that is presented at, or applied to, an output to the gain stage to compensate the variable gain amplifier. By using the analog gain control signal, which is provided based on a bit resolution of the digital gain code, the gain of the resistor divider is adjusted precisely as gain of the variable gain amplifier changes. This in turn adjusts compensation of the variable gain amplifier changes in precise amounts and continuously responsive to the changes in gain.

At 912, the compensated variable gain amplifier amplifies a signal at the adjusted gain of the variable gain amplifier that is adjusted responsive to the first MOSFET. In an embodiment, the input signal includes an analog signal read from a media disk or a wireless signal received via an antenna. An overall gain of the variable gain amplifier at which the signal is amplified is defined approximately by the first MOSFET and an input resistor of the variable gain amplifier.

System-On-Chip

Figure 10:
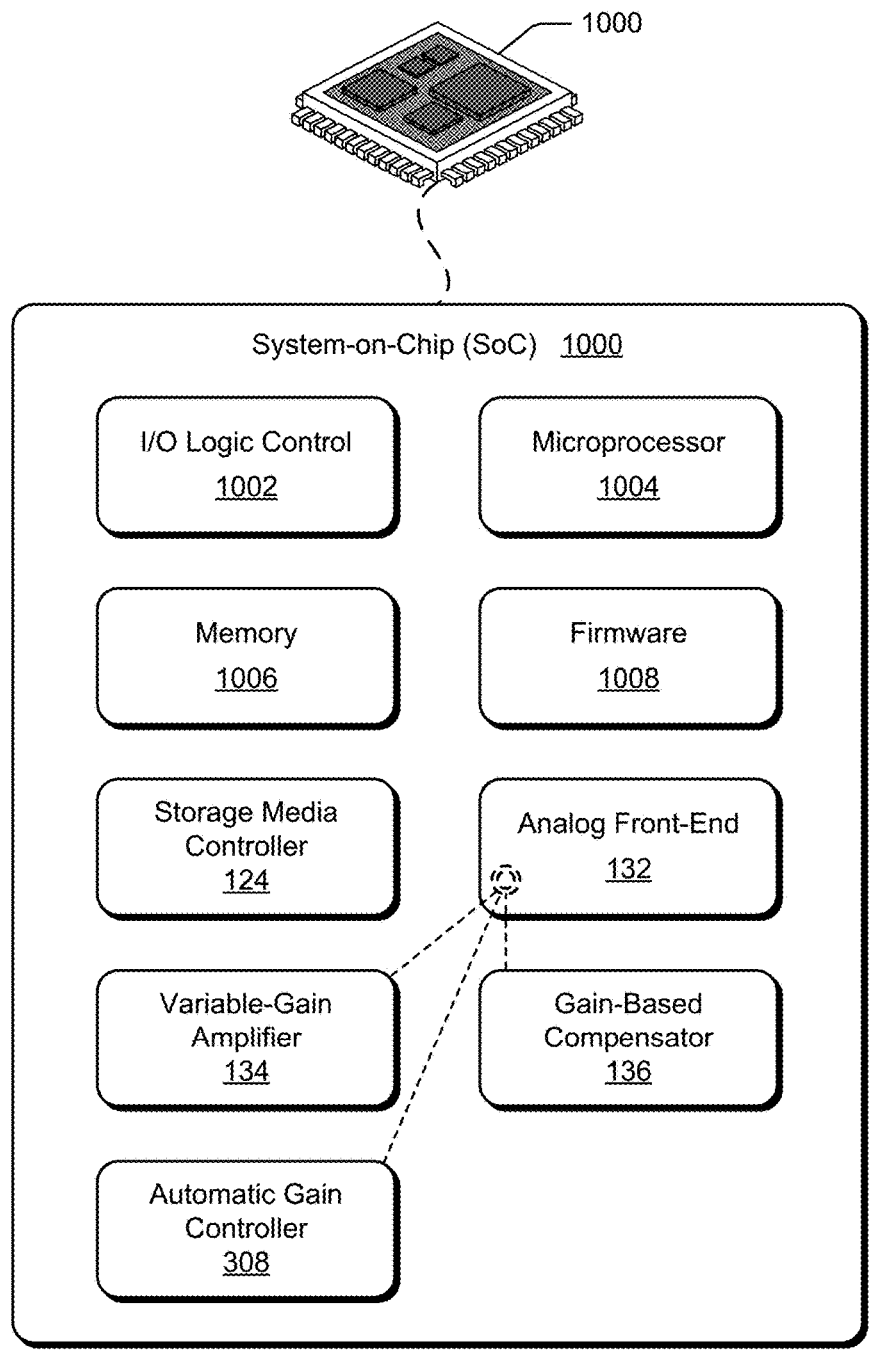
FIG. 10 illustrates an example System-on-Chip (SoC) implemented with components of the analog front-end seen in FIG. 3.
Figure 11:
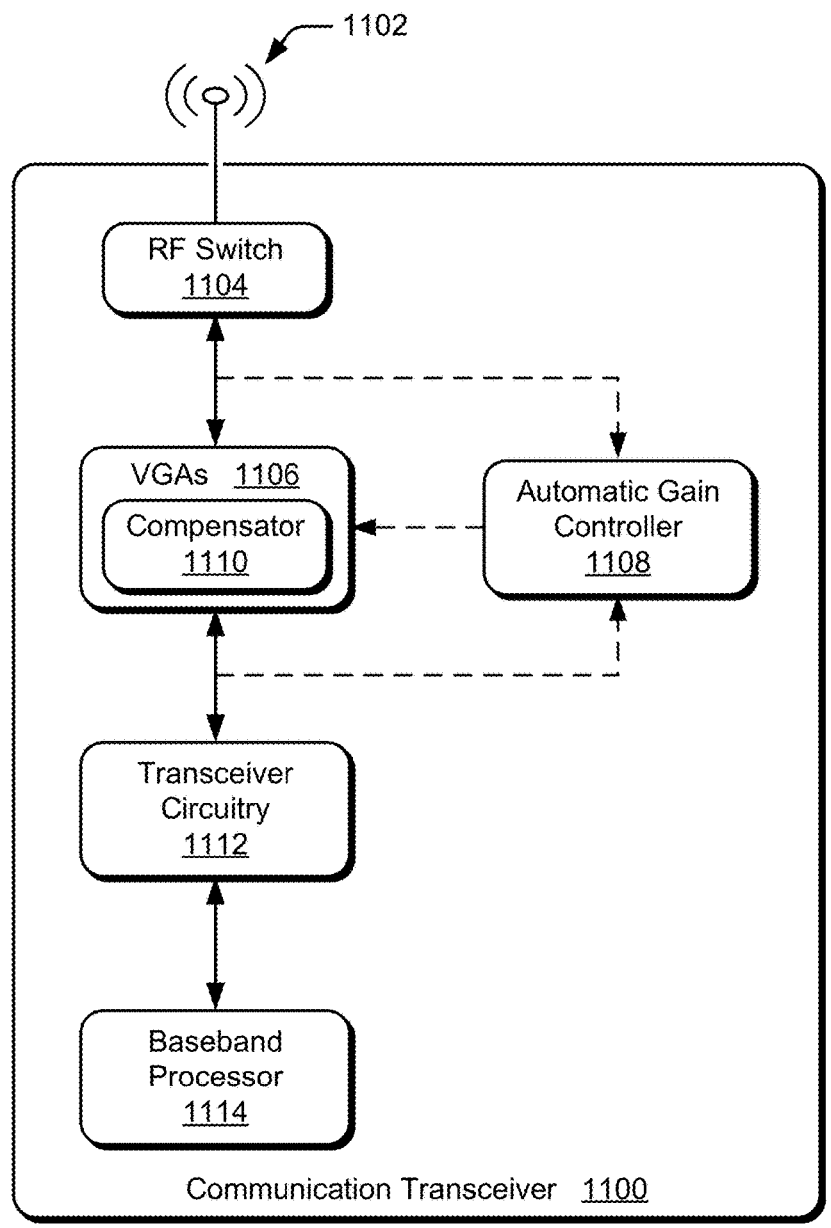
FIG. 11 illustrates an example communication transceiver in which an embodiment of a variable gain amplifier with gain-based compensation is implemented.

FIG. 10 illustrates an example System-on-Chip (SoC) 1000 in which components of an analog front-end are implemented. The SoC 1000 is configurable to enable the amplification of analog signals in a variety of devices, such as a gaming console, set-top box, network-attached storage, video game console, vehicle-based computing system, hard-disk drive, or any other suitable type of device. Although described with reference to a SoC, any or all entities of FIG. 10 are configurable as, or within, a storage media controller, application-specific integrated-circuit (ASIC), communications controller, or application-specific standard product (ASSP).

In this example, various components of the SoC 1000 include I/O control logic 1002 (e.g., to include electronic circuitry) and a microprocessor 1004 (e.g., any of a microcontroller core, processor core, application processor, DSP, or the like). The SoC 1000 may also include various applications, operating systems, software, and/or firmware (e.g., features and functions), which are embodied as processor-executable instructions maintained by the memory 1006 and executed by the microprocessor 1004. In this example, the SoC 1000 includes firmware 1008 implemented to manage the functionalities of the SoC. The SoC 1000 also includes a storage media controller 124 to facilitate access to off-chip storage media, such as storage media disks or other bulk storage media. When implemented to control or facilitate storage media access, the SoC 1000 also includes a storage media interface (not shown) to access the storage media.

The SoC 1000 also includes an analog front-end 132, variable gain amplifier 134, compensator 136, and automatic gain controller 306, which are implemented as described in relation to various embodiments presented herein. Examples of these components, along with their relationship and corresponding functionality, are described throughout the disclosure. In this embodiment, an automatic gain controller 306 of the analog front-end 132 is implemented, either in whole or part, as processor-executable instructions maintained by the memory 1006 and executed by the microprocessor 1004 to implement various aspects and/or features described throughout the disclosure.

Communication Transceiver

FIG. 1100 illustrates an example communication transceiver 1100 in which an amplifier with gain-based compensation is implemented. In this example, the communication transceiver 1100 is configured as a wireless communication transceiver capable of transmitting and/or receiving wireless signals through antenna 1102. The communication transceiver 1100 communicates via any suitable type of peer-to-peer link or wireless network, such as a wireless local-area-network (WLAN), ad-hoc WLAN, wireless mesh network, near-field communication (NFC) link, or wireless personal-area-network (WPAN). Alternately, the communication transceiver 1100 is configurable as a wired communication transceiver to communicate via a wired network (e.g., Ethernet), low-voltage differential swing (LVDS) interface, or fiber-optic network.

In this example, the antenna 1102 is connected to a radio frequency (RF) switch 1104, which enables the bi-directional communication of signals between the antenna 1102 and one or more variable gain amplifiers 1106 of the communication transceiver 1100. In some cases, a variable gain amplifier 1106 is implemented as a low-noise variable amplifier in a receive path of the communication transceiver 1100. Another of the variable gain amplifiers 1106 is also implemented as a variable gain power amplifier in a transmit path of the communication transceiver 1100. As indicated by the bi-directional arrows between components of the communication transceiver 1100, the variable gain amplifiers 1106 amplify signals received via the antenna 1102 or amplify signals prior to transmission by the antenna 1102. For visual brevity, other components of respective transmit and receive paths have been omitted, but may include any suitable type of component or module, such as a filter, diplexer, balun, transformer, mixer, modulator, de-modulator, or the like.

The communication transceiver 1100 also includes an automatic gain controller 1108. In this example, the automatic gain controller 1108 includes a peak detector or power meter (not shown) to sense (e.g., measure or characterize) respective amplitudes of amplified signals in the transmit or receive paths of the communication transceiver 1100. The automatic gain controller 1108 determines an amplitude of a signal amplified by the variable gain amplifier 1106 for transmission or an amplitude of a received signal that is amplified by the variable gain amplifier 1106 for subsequent demodulation or processing. Based on the amplitude or strength of a signal, the automatic gain controller 1108 sets or adjusts a respective gain of one or more of the variable gain amplifiers 1106. To do so, the automatic gain controller 1106 generates gain codes based on desired gain settings and converts the gain codes to analog gain controls signals as described with reference to FIGS. 1-9.

The variable gain amplifiers 1106, each of which includes an instance of a gain-based compensator 1110 (compensator 1110), amplify signals based on the gain setting (e.g., analog gain control signal) or configuration provided by the automatic gain controller 1108. Generally, the variable gain amplifiers 1106 amplify signals with varying amounts of gain to provide signals that are suitable for transmission via the antenna 1102 or for demodulation by transceiver circuitry 1112 of the communication transceiver 1100. As described herein, the compensator 1110 compensates a gain stage (not shown) of a variable gain amplifier 1106 in proportion to the varying gain such that bandwidth of the variable gain amplifier 1106 changes smoothly or gradually across a wide range of gain settings. In some embodiments, the compensator 1110 continuously alters a gain of a compensation stage or variable resistor network (not shown) of the variable gain amplifier 1106 to adjust an amount of compensation capacitance applied to an output of the gain stage for compensation. By so doing, discontinuous changes in bandwidth and/or delay in the signal processing chain are avoided while amplifier gain and compensation are varied. This in turn improves signal processing performance, data throughput, or bit-error rates of the communication transceiver 1100. In the case of received signals, the amplified signals are then down-converted or demodulated by the transceiver circuitry 1112, and sent on to a baseband processor 1114 for decoding or further processing.

Although the subject matter has been described in language specific to structural features and/or methodological operations, it is noted that the subject matter defined in the appended claims is not necessarily limited to the specific features or operations described herein, including orders in which they are performed.

What is claimed is:

1. A method for amplifying an analog signal read from a magnetic media disk, the method comprising:
   receiving the analog signal from a read head configured to generate the analog signal based on digital data stored on the magnetic media disk;
   determining a gain setting for a variable gain amplifier having a gain stage, an output stage, a compensation stage coupled to an output of the output stage, and a capacitor coupled between an output of the gain stage and an output of the compensation stage;
   configuring, based on the gain setting, a gain of the variable gain amplifier by which to amplify a signal;
   configuring, based on the gain setting, a gain of the compensation stage to alter an effective capacitance of the capacitor;
   compensating, at the output of the gain stage, the variable gain amplifier with the effective capacitance of the capacitor; and
   amplifying the signal at the configured gain with the compensated gain stage of the variable gain amplifier.

2. The method for amplifying the analog signal read from the magnetic media disk as recited in claim 1, wherein:
   the compensation stage of the variable gain amplifier includes a resistor network or a resistor-divider stage; and configuring the gain of the resistor network or resistor-divider stage comprises altering a resistance of at least one variable resistor of the resistor network or the resistor-divider stage.

3. The method for amplifying the analog signal read from the magnetic media disk as recited in claim 1, wherein:
configuring the gain of the variable gain amplifier comprises altering a resistance of a first variable resistor coupled between the output of variable gain amplifier and an input of the gain stage; and
configuring the gain of the compensation stage comprises altering a resistance of a second variable resistor coupled to at least one of the output of the compensation stage or the capacitor.

4. The method for amplifying the analog signal read from the magnetic media disk as recited in claim 3, further comprising:
determining, based on the gain setting, a digital gain code of bits indicative of the gain setting;
converting, via a digital-to-analog converter, the digital gain code to an analog gain control signal; and
altering, based on the analog gain control signal, the resistance of one or more of the first variable resistor and the resistance of the second variable resistor.

5. The method for amplifying the analog signal read from the magnetic media disk as recited in claim 4, wherein the respective resistances of both the first variable resistor and second variable resistor are varied based on the same analog gain control signal.

6. The method for amplifying the analog signal read from the magnetic media disk as recited in claim 4, wherein varying the resistance of the second resistor based on the analog gain control signal is effective to provide a range of compensation capacitance values at the output of the gain stage that correspond approximately with a bit resolution of the digital gain code.

7. The method for amplifying the analog signal read from the magnetic media disk as recited in claim 1, further comprising:
receiving, from an analog-to-digital converter, an indication of an amplitude of the analog amplified signal that is amplified by the variable gain amplifier; and
determining, based on the indication of the amplitude, the gain setting for the variable gain amplifier.

8. A data storage apparatus comprising:
a media disk configured to store digital data;
a read head configured to generate an analog signal based on the digital data stored on the media disk;
an analog front-end comprising:
a variable gain amplifier that includes (i) a gain stage configured to amplify the analog signal to provide an amplified analog signal, (ii) an output stage configured to drive an output of the variable gain amplifier, (iii) a compensation stage coupled to an output of the output stage, and (iii) a capacitor disposed between an output of the gain stage and an output of the compensation stage;
an automatic gain controller configured to:
determine a gain setting for the variable gain amplifier;
set, based on the gain setting, a gain of the variable gain amplifier by which to amplify the analog signal;
selectively set, based on the gain setting, a gain of the compensation stage to alter an effective capacitance of the capacitor; and
apply the effective capacitance to the output of the gain stage to compensate the variable gain amplifier;
an analog-to-digital converter configured to convert the amplified analog signal to a digital signal; and
a digital processor configured to decode, based on the digital signal, the digital data stored on the media disk.

9. The data storage apparatus as recited in claim 8, wherein:
the compensation stage of the variable gain amplifier comprises a resistor network coupled between the output of the output stage and the capacitor that is coupled to the output of the gain stage; and
the automatic gain controller is further configured to selectively set the gain of the resistor network by altering a resistance provided by a variable resistor of the resistor network.

10. The data storage apparatus as recited in claim 9, wherein the variable resistor is a first variable resistor and automatic gain controller is further configured to:
generate an analog gain control signal to set the gain of variable gain amplifier via a second variable resistor that governs the gain of the variable gain amplifier; and
apply the analog gain control signal to a gate of a transistor by which the first variable resistor is implemented to selectively set the gain of the resistor network.

11. The data storage apparatus as recited in claim 10, wherein:
the automatic gain controller is further configured to generate the analog gain control signal based on a digital gain code; and
applying the analog gain control to the gate of the transistor by which the first variable resistor is implemented is effective to provide a range of compensation capacitance values at the output of the gain stage that correspond approximately with a bit resolution of the digital gain code.

12. The data storage apparatus as recited in claim 11, wherein the bit resolution of the digital gain code is at least eight bits and the range of compensation capacitance values applied to the output of the gain stage include approximately 256 different compensation capacitance values.

13. The data storage apparatus as recited in claim 8, wherein:
the gain stage of the variable gain amplifier is implemented as a first differential amplifier;
the compensation stage of the variable gain amplifier is implemented as a second differential amplifier; and
a differential output of the first differential amplifier is connected directly to a differential input of the second amplifier.

14. The data storage apparatus as recited in claim 13, wherein a differential output of the second amplifier is connected directly to a differential output of the variable gain amplifier.

15. The data storage apparatus as recited in claim 8, wherein the apparatus is implemented in whole or part as a hard disk drive, a network-attached storage device, a set-top box, or a gaming console.

16. A System-on-Chip (SoC) for processing signals read from a magnetic media disk, the SoC comprising:
an input configured to receive an analog signal from a magnetic media read head;
a variable gain amplifier configured to amplify the analog signal, the variable amplifier including:

a gain stage configured to amplify the analog signal to provide an amplified analog signal;

an output stage configured to drive a variable resistor by which gain of the variable gain amplifier is selectably configurable; and a compensation stage having an output coupled to a variable capacitor that is coupled to an output of the gain stage;

an analog-to-digital converter configured to convert the amplified analog signal to a digital signal;

an output configured to transmit the digital signal; and a gain controller configured to:
adjust, based on the digital signal, a gain setting of the variable gain amplifier via the variable resistor; and adjust, based on the gain setting of the gain stage, a gain setting of the compensation stage to alter an effective capacitance of the variable capacitor; and apply, to the output of the gain stage, the effective capacitance of the variable capacitor to compensate the variable gain amplifier.

17. The SoC for processing signals read from a magnetic media disk as recited in claim 16, wherein:
the variable resistor is a first variable resistor by which gain of the variable gain amplifier is governed;

compensation stage comprises a resistor-divider stage that includes a second variable resistor by which gain of the resistor-divide stage is governed; and the gain controller is configured to adjust the respective gain settings of the variable gain amplifier and the resistor-divider stage by varying respective resistances of the first and second variable resistors using a same analog control signal.

18. The SoC for processing signals read from a magnetic media disk as recited in claim 17, wherein:
the gain controller is further configured to generate the analog gain control signal based on a digital gain code; and adjusting the second variable resistor based on the analog control signal is effective to provide a range of different capacitance values at the output of the gain stage that correspond to a bit resolution of the digital gain code.

19. The SoC for processing signals read from a magnetic media disk as recited in claim 18, wherein the digital gain code has a bit resolution of eight bits and the range of different capacitance values includes approximately 256 different capacitance values.

20. The SoC for processing signals read from a magnetic media disk as recited in claim 16, wherein the System-on-Chip is implemented in whole or part as an analog front-end module, media drive controller, media drive read element, radio-frequency (RF) front-end, or communication transceiver.

* * * * *